(12) United States Patent
Kim (10) Patent No.: US 10,756,076 B2
(45) Date of Patent: Aug. 25, 2020

(54) SEMICONDUCTOR PACKAGE

(71) Applicant: Samsung Electronics Co., Ltd., Suwon-si, Gyeonggi-do (KR)

(72) Inventor: Yonghoon Kim, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/201,361

(22) Filed: Nov. 27, 2018

(65) Prior Publication Data
US 2019/0244945 A1    Aug. 8, 2019

(30) Foreign Application Priority Data

Feb. 6, 2018    (KR) .................. 10-2018-0014677

(51) Int. Cl.
| | |
|---|---|
| *H01L 25/18* | (2006.01) |
| *H01L 25/065* | (2006.01) |
| *H01L 23/00* | (2006.01) |
| *H01L 23/50* | (2006.01) |
| *H01L 25/11* | (2006.01) |
| *H01L 25/07* | (2006.01) |

(52) U.S. Cl.
CPC .............. *H01L 25/18* (2013.01); *H01L 23/50* (2013.01); *H01L 24/02* (2013.01); *H01L 24/13* (2013.01); *H01L 25/0652* (2013.01); *H01L 25/071* (2013.01); *H01L 25/112* (2013.01); *H01L 24/16* (2013.01); *H01L 2224/02331* (2013.01); *H01L 2224/02372* (2013.01); *H01L 2224/02373* (2013.01); *H01L 2224/02379* (2013.01); *H01L 2224/13024* (2013.01); *H01L 2224/16146* (2013.01); *H01L 2224/16237* (2013.01); *H01L 2224/17181* (2013.01); *H01L 2225/06513* (2013.01); *H01L 2225/06517* (2013.01); *H01L 2225/06541* (2013.01); *H01L 2924/1431* (2013.01); *H01L 2924/14361* (2013.01)

(58) Field of Classification Search
CPC ... H01L 25/0652; H01L 25/071; H01L 25/112
USPC .................................................. 257/737, 774
See application file for complete search history.

(56) References Cited

U.S. PATENT DOCUMENTS

| | | |
|---|---|---|
| 6,911,844 B2 | 6/2005 | Sasaki et al. |
| 8,811,055 B2 | 8/2014 | Yoon |
| 9,026,872 B2 | 5/2015 | Camarota |

(Continued)

*Primary Examiner* — David Vu
*Assistant Examiner* — Brandon C Fox
(74) *Attorney, Agent, or Firm* — Lee IP Law, P.C.

(57) ABSTRACT

A semiconductor package includes a package substrate, a logic chip on the package substrate, a memory stack structure on the package substrate and including first and second semiconductor chips stacked along a first direction, and a first bump between the package substrate and the memory stack structure. The logic chip and the memory stack are spaced apart along a second direction, crossing the first direction, on the package substrate. The first semiconductor chip includes a through via electrically connected to the second semiconductor chip, a chip signal pad connected to the through via, and a first redistribution layer electrically connected to the chip signal pad and having an edge signal pad in contact with the first bump. A distance between the logic chip and the edge signal pad along the second direction is less than that between the logic chip and the chip signal pad.

13 Claims, 7 Drawing Sheets

(56) References Cited

U.S. PATENT DOCUMENTS

| | | | |
|---|---|---|---|
| 9,147,663 B2 | 9/2015 | Liu et al. | |
| 9,589,670 B2 | 3/2017 | Kim | |
| 9,685,422 B2 | 6/2017 | Lee | |
| 9,941,253 B1* | 4/2018 | Jung | H01L 25/50 |
| 2017/0069369 A1* | 3/2017 | Kim | G11C 11/4093 |
| 2017/0084574 A1* | 3/2017 | Lee | H01L 25/0652 |
| 2017/0373037 A1* | 12/2017 | Yu | H01L 24/18 |
| 2018/0006006 A1* | 1/2018 | Kim | H01L 24/17 |
| 2018/0012867 A1* | 1/2018 | Kim | H01L 24/14 |
| 2018/0157782 A1* | 6/2018 | Rossi | G06F 17/5077 |
| 2018/0166420 A1* | 6/2018 | Park | H01L 25/0657 |
| 2018/0294249 A1* | 10/2018 | Watanabe | H01L 24/96 |
| 2019/0259695 A1* | 8/2019 | Gandhi | H01L 25/0657 |

* cited by examiner

SEMICONDUCTOR PACKAGE

CROSS-REFERENCE TO RELATED APPLICATION

Korean Patent Application No. 10-2018-0014677 filed on Feb. 6, 2018, in the Korean Intellectual Property Office, and entitled: "Semiconductor Package," is incorporated by reference herein in its entirety.

BACKGROUND

1. Field

Embodiments relate to a semiconductor package, and more particularly, to a semiconductor package in which a logic chip and a memory stack structure are side by side on a substrate.

2. Description of the Related Art

Typically, a semiconductor package includes a semiconductor chip mounted on a printed circuit board (PCB) and bonding wires or bumps that electrically connect the semiconductor chip to the printed circuit board.

SUMMARY

According to exemplary embodiments, a semiconductor package may include a package substrate, a logic chip on the package substrate, a memory stack structure on the package substrate, and a first bump between the package substrate and the memory stack structure. The memory stack structure may include a first semiconductor chip and a second semiconductor chip stacked on the first semiconductor chip along a first direction. The memory stack structure may be spaced apart from the logic chip along a second direction, crossing the first direction. The first semiconductor chip may include a through via electrically connected to the second semiconductor chip, a chip signal pad connected to the through via, and a first redistribution layer electrically connected to the chip signal pad and having an edge signal pad in contact with the first bump. A distance between the logic chip and the edge signal pad along the second direction is less that between the logic chip and the chip signal pad.

According to exemplary embodiments, a semiconductor package may include a package substrate including a routing line, a logic chip on the package substrate, and a memory stack structure on the package substrate. The memory stack structure may include a first semiconductor chip and a second semiconductor chip stacked on the first semiconductor chip along a first direction. The memory stack structure may be spaced apart from the logic chip along a second direction, crossing the first direction. A first sidewall of the logic chip may face a second sidewall of the first semiconductor chip along the second direction. The logic chip may include a logic signal pad adjacent to the first sidewall. The first semiconductor chip may include a through via electrically connected to the second semiconductor chip, a chip signal pad connected to the through via and a first redistribution layer electrically connected to the chip signal pad and having an edge signal pad adjacent to the second sidewall. The logic signal pad and the edge signal pad may be electrically connected to each other through the routing line.

According to exemplary embodiments, a semiconductor package may include a package substrate, a logic chip on the package substrate and including a plurality of first signal pads, and a memory stack structure on the package substrate and including a plurality of semiconductor chips stacked along a first direction, the plurality of semiconductor chips being connected to each other by a plurality of through vias. The memory stack structure may have a first area adjacent to the logic chip along a second direction, crossing the first direction, and a second area at a center of the memory stack structure. The memory stack structure may further include a plurality of second signal pads on the first area and spaced apart from the second area along the second direction, and a plurality of bumps between the package substrate and the first and second signal pads, the plurality of bumps being spaced apart from the second area along the second direction.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
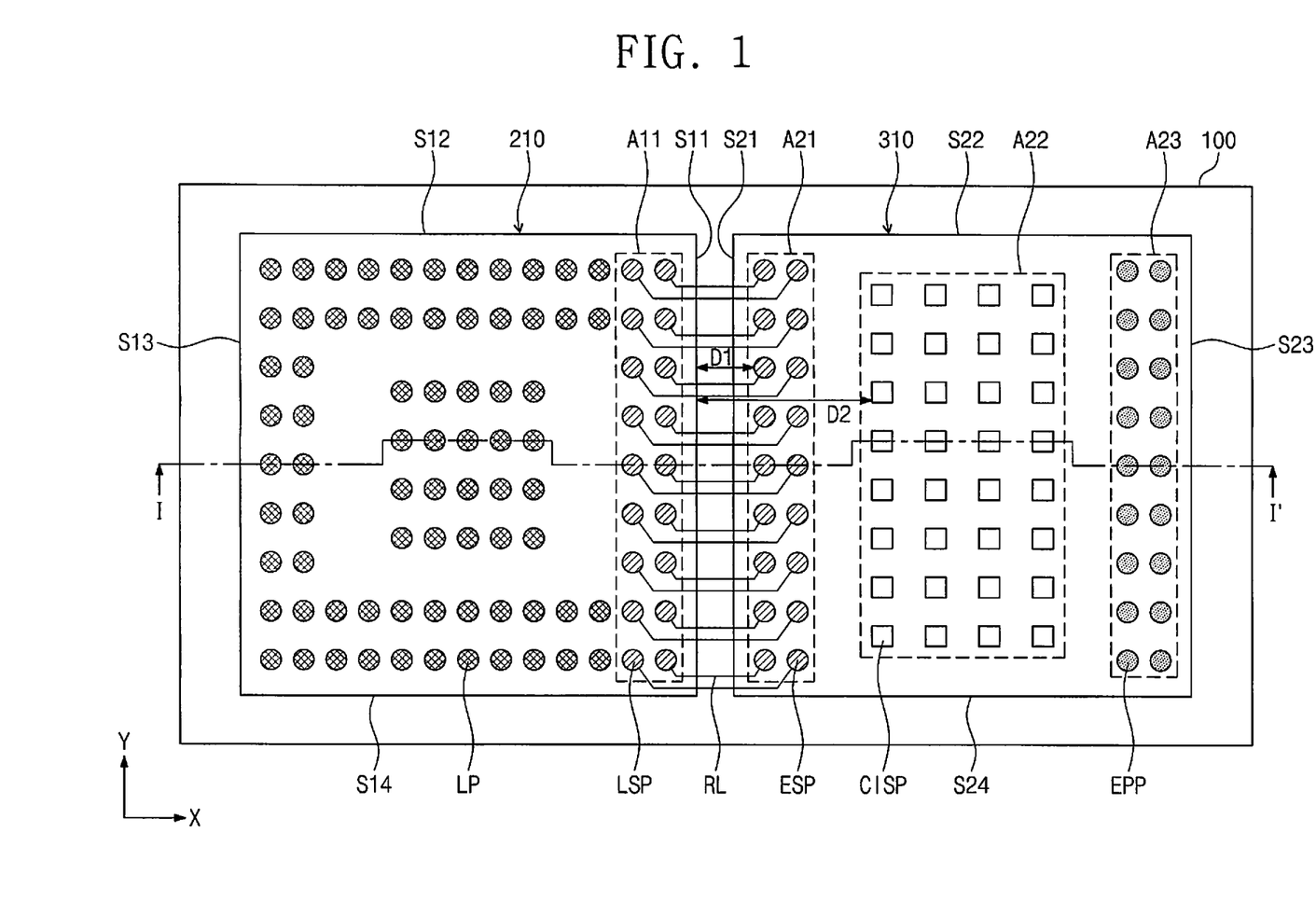
FIG. 1 illustrates a plan view showing a semiconductor package according to exemplary embodiments.
Figure 2:
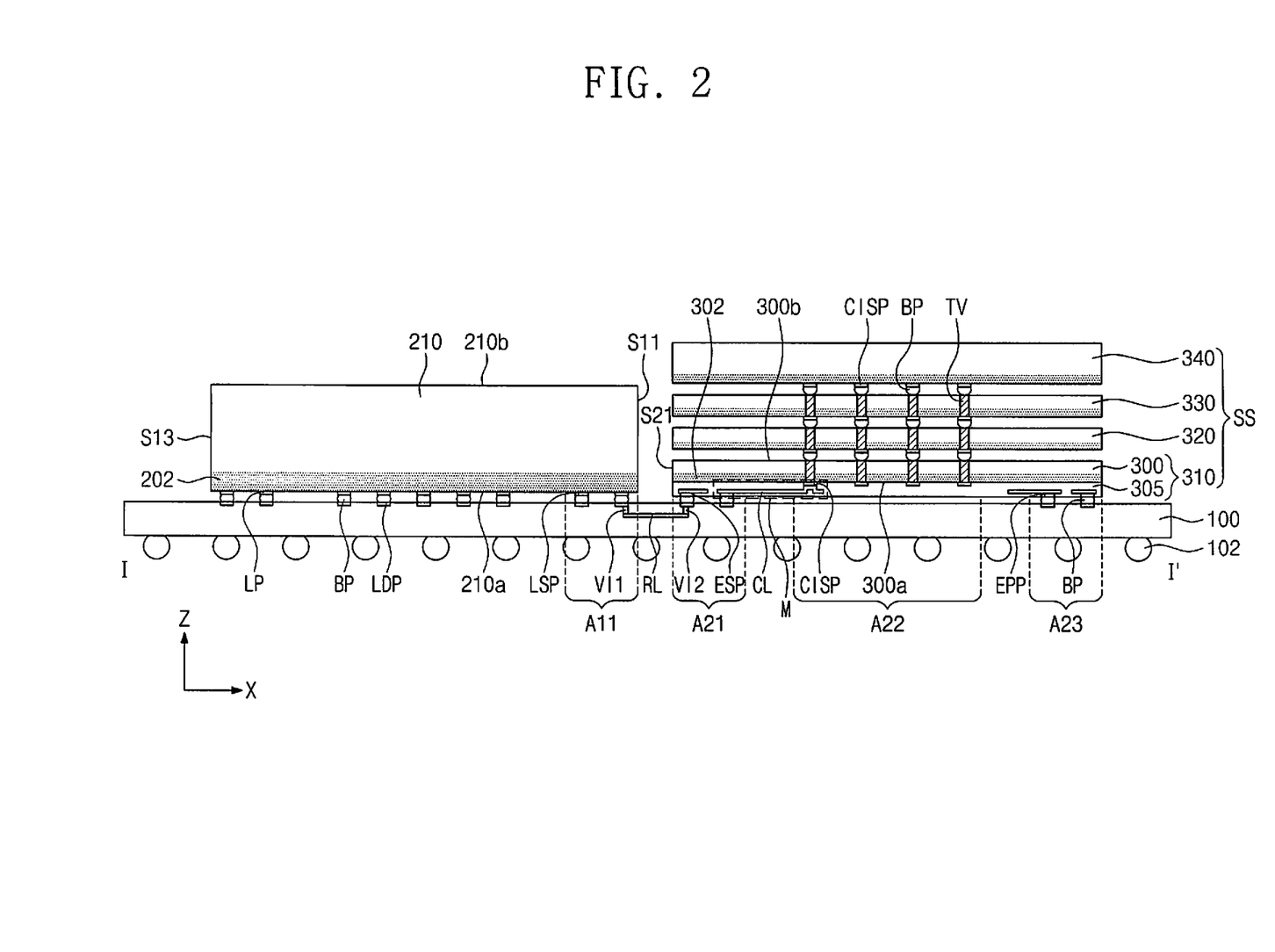
FIG. 2 illustrates a cross-sectional view taken along line I-I' of FIG. 1, showing a semiconductor package according to exemplary embodiments.
Figure 3:
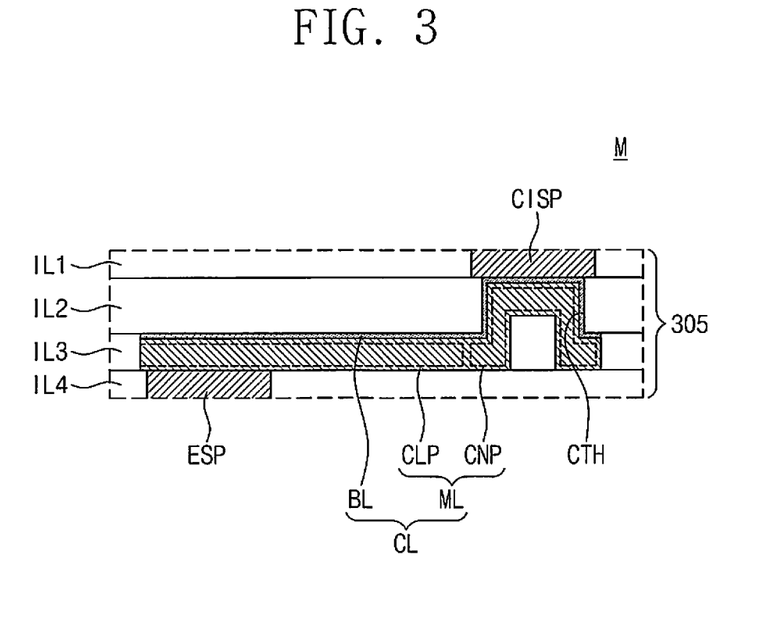
FIG. 3 illustrates an enlarged cross-sectional view showing section M of FIG. 2.

FIG. 1 illustrates a plan view showing a semiconductor package according to exemplary embodiments. FIG. 2 illustrates a cross-sectional view taken along line I-I' of FIG. 1. FIG. 3 illustrates an enlarged cross-sectional view showing section M of FIG. 2.

Referring to FIGS. 1 to 3 a logic chip 210 and a memory stack structure SS may be provided on a package substrate 100. The logic chip 210 and the memory stack structure SS may be mounted on a top surface the package substrate 100 along a z-direction and side by side, e.g., spaced apart along an x-direction, on the package substrate 100. For example, the package substrate 100 may be a printed circuit board (PCB) or a redistribution substrate. External connection members 102, e.g., solder balls, may be provided on a bottom surface, opposite the top surface along the z-direction, of the package substrate 100. The package substrate 100 may be provided on its top surface with landing pads LDP. Routing lines RL and at least one via VI may be included in the package substrate 100.

The logic chip 210 may include therein a central processing unit (CPU), a physical layer region, and/or a controller. The logic chip 210 may include first to fourth sidewalls S11, S12, S13, and S14. The first and third sidewalls S11 and S13 of the logic chip 210 may be opposite each other along the x-direction. The second and fourth sidewalls S12 and S14 of the logic chip 210 may be opposite each other along a y-direction. The logic chip 210 may include a first area A11 adjacent to the first sidewall S11. The first area A11 may extend along the first sidewall S11 along the y-direction. The first area A11 may be an edge area spaced apart from a central area of the logic chip 210.

The logic chip 210 may have a first surface 210a facing the package substrate 100 and a second surface 210b opposite to the first surface 210a along the z-direction. The logic chip 210 may include an active layer 202 adjacent to the first surface 210a. The active layer 202 may include transistors on a substrate of the logic chip 210 and wiring layers on the transistors. A logic circuit may be constituted by the transistors and the wiring layers in the active layer 202. The logic chip 210 may be mounted on the package substrate 100 in a face-down state where the active layer 202 faces the package substrate 100.

The active layer 202 of the logic chip 210 may be provided thereon with logic pads LP and logic signal pads LSP. The logic signal pads LSP may be selectively provided on the first area A11 of the logic chip 210. For example, the logic signal pads LSP may be on the first area A11 of the logic chip 210, and may not be on any other area (e.g., the central area of the logic chip 210). The logic pads LP may be selectively provided on the any other area except for the first area A11 of the logic chip 210. The logic chip 210 may receive or transmit through the logic signal pads LSP one or more of command signals, access signals, and data signals.

Bumps BP may be between the logic chip 210 and the package substrate 100. The bumps BP may be between the logic pads LP of the logic chip 210 and the landing pads LDP of the package substrate 100. The bumps BP may be between the logic signal pads LSP of the logic chip 210 and the landing pads LDP of the package substrate 100. The bumps BP may be used for mounting the logic chip 210 on the package substrate 100 in a flip-chip bonding manner. An under-fill resin layer may fill between the logic chip 210 and the package substrate 100.

The memory stack structure SS may include first to fourth semiconductor chips 310, 320, 330, and 340 that are sequentially stacked on the package substrate 100 along the z-direction. The first to fourth semiconductor chips 310, 320, 330, and 340 may be memory chips. For example, each of the first to fourth semiconductor chips 310, 320, 330, and 340 may be a Low Power Double Data Rate Synchronous Dynamic Random Access Memory (LPDDR), e.g., LPDDR1, LPDDR2, LPDDR3, LPDDR3E, and the like.

The first to fourth semiconductor chips 310, 320, 330, and 340 may have substantially the same shape and size in a plan view, e.g., along the x- and y-directions. The fourth semiconductor chip 340 may have a thickness, e.g., along the z-direction, greater than those of the first to third semiconductor chips 310, 320, and 330. The first semiconductor chip 310 may further include an additional redistribution layer 305, not included in the second to fourth semiconductor chips 320, 330, and 340.

Each of the first to fourth semiconductor chips 310, 320, 330, and 340 may have a first surface 300a facing the package substrate 100 and a second surface 300b standing opposite to the first surface 300a. Each of the first to fourth semiconductor chips 310, 320, 330, and 340 may include an active layer 302 adjacent to the first surface 300a. The active layer 302 may include transistors on a substrate 300 of each of the first to fourth semiconductor chips 310, 320, 330, and 340, and wiring layers on the transistors. A memory circuit may be formed by the transistors and the wiring layers in the active layer 302. For example, the first semiconductor chip 310 may be mounted on the package substrate 100 in a face-down state where the active layer 302 faces the top surface of the package substrate 100.

Each of the first to third semiconductor chips 310, 320, and 330 may include through vias TV that penetrate therethrough along the z-direction and are electrically connected to the active layer 302. The fourth semiconductor chip 340 may not include the through vias TV.

Each of the first to fourth semiconductor chips 310, 320, 330, and 340 may include chip signal pads CISP on the active layer 302. The chip signal pads CISP may be command input/output pads, access input/output pads, and/or data input/output pads of the first to fourth semiconductor chips 310, 320, 330, and 340. For example, the chip signal pads CISP of the first to fourth semiconductor chips 310, 320, 330, and 340 may vertically overlap, e.g., along the z-direction each other.

The first semiconductor chip 310 may include a redistribution layer 305 that covers the chip signal pads CISP on the active layer 302. The redistribution layer 305 may include edge signal pads ESP, edge power pads EPP, and conductive lines CL.

The edge signal pads ESP and the edge power pads EPP may be on a lower portion of the redistribution layer 305. At least one of the conductive lines CL may electrically connect the chip signal pad CISP and the edge signal pad ESP to each other. Each of the edge power pads EPP may be a power pad supplied with a power voltage or a ground voltage.

The first semiconductor chip 310 may include first to fourth sidewalls S21, S22, S23, and S24. The first and third sidewalls S21 and S23 of the first semiconductor chip 310 may opposite each other along the x-direction. The second and fourth sidewalls S22 and S24 of the first semiconductor chip 310 may be opposite each other along the y-direction. The first sidewall S11 of the logic chip 210 may be adjacent to and spaced from the first sidewall S21 of the first semiconductor chip 310 along the x-direction. The first sidewall S11 of the logic chip 210 may face the first sidewall S21 of the first semiconductor chip 310. The first sidewall S11 of the logic chip 210 and the first sidewall S21 of the first semiconductor chip 310 may extend parallel to each other along the y-direction.

The first semiconductor chip 310 may include a first area A21 adjacent to the first sidewall S21, a second area A22, and a third area A23 to the third sidewall S23. The second area A22 may be interposed between the first and third areas A21 and A23 along the x-direction. The second area A22 may be a central area of the first semiconductor chip 310. Each of the first and third areas A21 and A23 may be an edge area spaced apart from the central area of the first semiconductor chip 310 along the x-direction.

Since the first sidewall S11 of the logic chip 210 is adjacent to the first sidewall S21 of the first semiconductor chip 310, the first area A11 of the logic chip 210 may be adjacent to the first area A21 of the first semiconductor chip 310.

The edge signal pads ESP may be selectively disposed on the first area A21 of the first semiconductor chip 310. The chip signal pads CISP may be selectively disposed on the second area A22 of the first semiconductor chip 310. The edge power pads EPP may be selectively disposed on the third area A23 of the first semiconductor chip 310.

The conductive lines CL connect the chip signal pads CISP on the second area A22 of the first semiconductor chip 310 to the edge signal pads ESP on the first area A21 of the first semiconductor chip 310. For example, the conductive lines CL may redistribute input/output pads of the first semiconductor chip 310 from the second area A22 to the first area A21.

The redistribution layer 305 of the first semiconductor chip 310 will be further discussed in detail with reference to FIG. 3. The redistribution layer 305 may include first to fourth insulation layers IL1 IL2, IL3, and IL4 that are sequentially stacked on the active layer 302 of the first semiconductor chip 310 along the x-direction towards the top surface of the package substrate 100. The chip signal pads CISP may be in the first insulation layer IL1. The second insulation layer IL2 may have a contact hole CTH that exposes at least one of the chip signal pads CISP.

The second insulation layer IL2 may include the conductive line CL that fills the contact hole CTH and is electrically connected to the chip signal pad CISP. The conductive line CL may have a linear shape extending from the second area A22 of the first semiconductor chip 310 toward the first area A21 of the first semiconductor chip 310 along the x-direction. The conductive line CL may include a barrier layer BL and a conductive layer ML on the barrier layer BL. The barrier layer BL may be between the second insulation layer 1L2 and the conductive layer ML. The barrier layer BL may prevent a metallic material from diffusing from the conductive layer ML toward the active layer 302. For example, the barrier layer BL may include titanium (Ti), titanium nitride (TiN), or a combination thereof. The conductive layer ML may include copper (Cu) or aluminum (Al).

The conductive line CL may include a contact part CNP filling the contact hole CTH and a line part CLP extending from the contact part CNP toward the edge signal pad ESP along the x-direction. The contact part CNP may be in contact with the chip signal pad CISP and the line part CLP may be in contact with the edge signal pad ESP.

The third and fourth insulation layers IL3 and IL4 may cover the conductive line CL. The edge signal pad ESP may be in the fourth insulation layer IL4 on the conductive line CL.

Referring back to FIGS. 1 to 3, bumps BP may be between the first to fourth semiconductor chips 310, 320, 330, and 340. One or more under-fill resin layers may fill between the first to fourth semiconductor chips 310, 320, 330, and 340. The bumps BP may be connected to the through vias TV of the first to third semiconductor chips 310, 320, and 330. The first to fourth semiconductor chips 310, 320, 330, and 340 may be electrically connected to one another through the bumps BP and the through vias TV.

For example, the through vias TV may be connected to the chip signal pads CISP of each of the first to fourth semiconductor chips 310, 320, 330, and 340. Through the chip signal pads CISP and the through vias TV, the first to fourth semiconductor chips 310, 320, 330, and 340 may mutually communicate command signals, access signals, and/or data signals.

Bumps BP may be between the first semiconductor chip 310 and the package substrate 100. The bumps BP may be between the edge signal pads ESP the first semiconductor chip 310 and the landing pads LDP of the package substrate 100. The bumps BP may be between the edge power pads EPP the first semiconductor chip 310 and the landing pads LDP of the package substrate 100.

No bumps BP may be between the package substrate 100 and the second area A22 of the first semiconductor chip 310. The bumps BP may be spaced apart from the second area A22 of the first semiconductor chip 310. For example, the package substrate 100 and the second area A22 of the first semiconductor chip 310 may be include an insulating material (e.g., an under-fill resin layer or air) there between.

The bumps BP may mount the first semiconductor chip 310 on the package substrate 100 in a flip-chip bonding manner. An under-fill resin layer may fill between the first semiconductor chip 310 and the package substrate 100.

The routing lines RL in the package substrate 100 may electrically connect the logic signal pads LSP of the logic chip 210 to the edge signal pads ESP of the first semiconductor chip 310. For example, the routing lines RL may be provided in one wiring layer. Alternatively, the routing lines RL may be provided in two or more stacked wiring layers. A first via V11 may be between the routing line RL and the landing pad LDP of the package substrate 100 that is electrically connected to the logic signal pad LSP of the logic chip 210. A second via V12 may be between the routing line RL and the landing pad LDP of the package substrate 100 electrically connected to the edge signal pad ESP of the first semiconductor chip 310.

The logic chip 210 and the memory stack structure SS may mutually communicate input/output signals through the logic signal pads LSP of the logic chip 210, the routing lines RL of the package substrate 100, the edge signal pads ESP of the redistribution layer 305, the conductive lines CL, and the chip signal pads CISP.

Since the first area A11 of the logic chip 210 is adjacent to the first area A21 of the first semiconductor chip 310, the logic signal pads LSP may be spaced apart along the x-direction at a relatively small distance from the edge signal pads ESP. For example, along the x-direction, a minimum length of at least one routing line RL that connects the logic signal pad LSP to the edge signal pad ESP may be similar to a distance between the first sidewall S11 of the logic chip 210 and the first sidewall S21 of the first semiconductor chip 310.

When viewed in plan, the logic chip 210 may be spaced apart at a first distance D1 from one of the edge signal pads ESP (see FIG. 1) along the x-direction. When viewed in plan, the logic chip 210 may be spaced apart at a second distance D2 from one of the chip signal pads CISP (see FIG. 1) along the x-direction. The first distance D1 may be less than the second distance D2.

The logic signal pads LSP and the edge signal pads ESP may be connected at a relatively small distance (e.g., the first distance D1) through the bumps BP and the routing lines RL, which may increase a signal transfer speed between the logic chip 210 and the memory stack structure SS. Thus, a semiconductor package according to exemplary embodiments may improve in electrical characteristics and increase in operating speed. The logic chip 210 and the memory stack structure SS may be mounted side by side on the package substrate 100, which arrangement may decrease a thickness along the z-direction of the semiconductor package according to exemplary embodiments.

Figure 4:
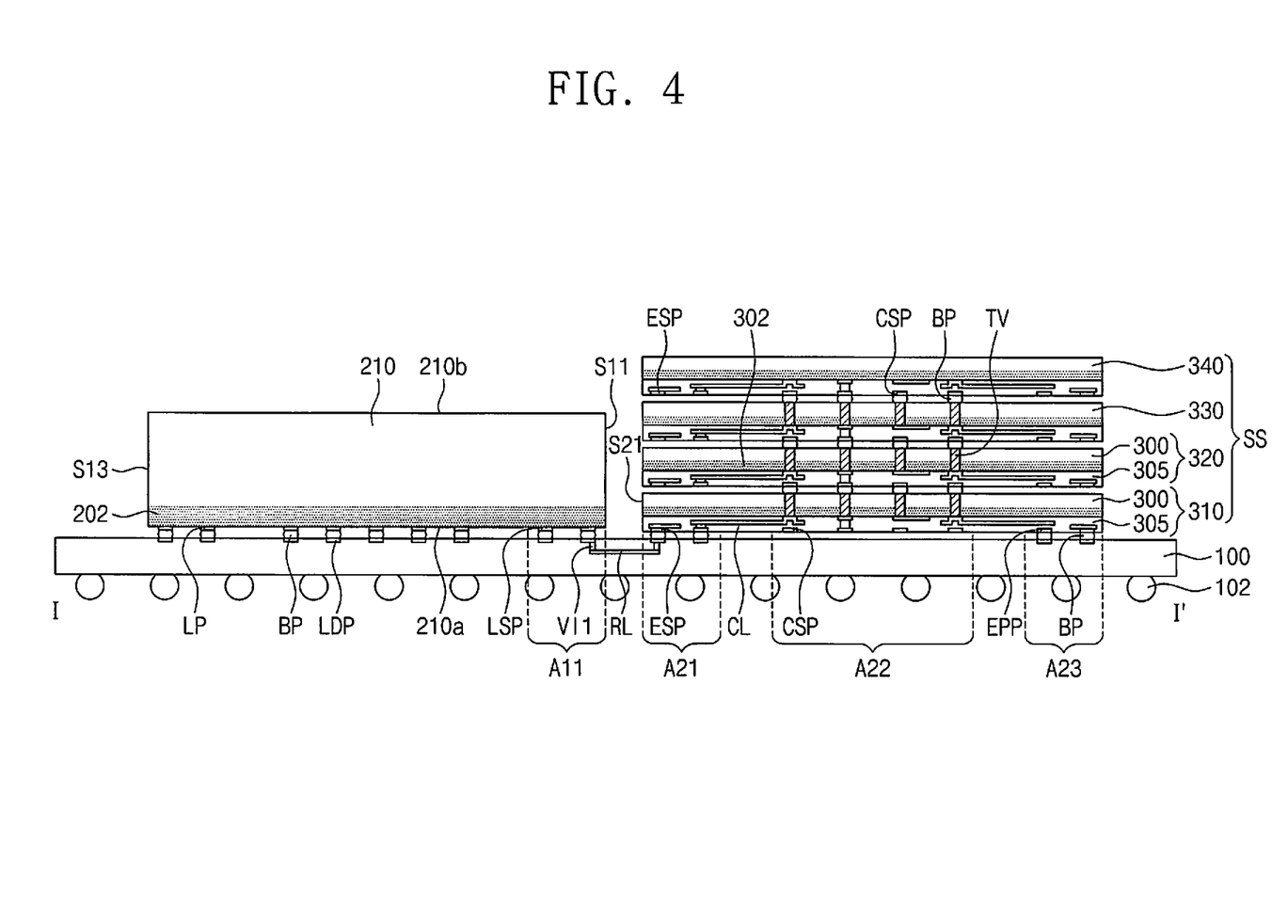
FIG. 4 illustrates a cross-sectional view taken along line I-I' of FIG. 1, showing a semiconductor package according to exemplary embodiments.

FIG. 4 illustrates a cross-sectional view taken along line I-I' of FIG. 1, showing a semiconductor package according to exemplary embodiments. In the embodiment that follows, a detailed description of technical features repetitive to those discussed above with reference to FIGS. 1 to 3 will be omitted, and differences there between will be explained in detail.

Referring to FIGS. 1 and 4, each of the first to fourth semiconductor chips 310, 320, 330, and 340 of the memory stack structure SS may include the substrate 300 and the redistribution layer 305 on the substrate 300. The redistribution layer 305 may be provided on the active layer 302 to electrically connected to a memory circuit in the active layer 302.

The redistribution layer 305 may include the edge signal pads ESP, the central signal pads CSP, the edge power pads EPP, and the conductive lines CL. The edge signal pads ESP, the central signal pads CSP, and the edge power pads EPP may be electrically connected through the conductive lines CL to the active layer 302. The edge signal pads ESP, the central signal pads CSP, and the edge power pads EPP may be provided on a lower portion of the redistribution layer 305.

The edge signal pads ESP may be selectively disposed on the first area A21 of the first semiconductor chip 310. The central signal pads CSP may be selectively disposed on the second area A22 of the first semiconductor chip 310. The edge power pads EPP may be selectively disposed on the third area A23 of the first semiconductor chip 310.

Each of the second to fourth semiconductor chips 320, 330, and 340 may include a redistribution layer 305 substantially the same as the redistribution layer 305 of the first semiconductor chip 310. Each of the second to fourth semiconductor chips 320, 330, and 340 may thus include edge signal pads ESP in addition to the central signal pads CSP. The fourth semiconductor chip 340 may have a same thickness along the z-direction as the first to third semiconductor chips 3210, 320, and 330.

In some embodiments, the bumps BP may be on the central signal pads CSP of each of the second to fourth semiconductor chips 320, 330, and 340. No bumps BP may be provided on the edge signal pads ESP of each of the second to fourth semiconductor chips 320, 330, and 340. For example, the edge signal pads ESP of each of the second to fourth semiconductor chips 320, 330, and 340 may be dummy pads.

In some embodiments, no bumps BP may be provided on the central signal pads CSP of the first semiconductor chip 310. The bumps BP may be provided on the edge signal pads ESP of the first semiconductor chip 310. For example, the central signal pads CSP of the first semiconductor chip 310 may be dummy pads.

The edge signal pads ESP of the first semiconductor chip 310 may be closer than the central signal pads CSP to the logic chip 210. For the first semiconductor chip 310 connected to the package substrate 100, the bumps BP may be selectively disposed on the edge signal pads ESP except for the central signal pads CSP. In such a configuration, an electrical connection path between the logic chip 210 and the memory stack structure SS may be decreased.

Figure 5:
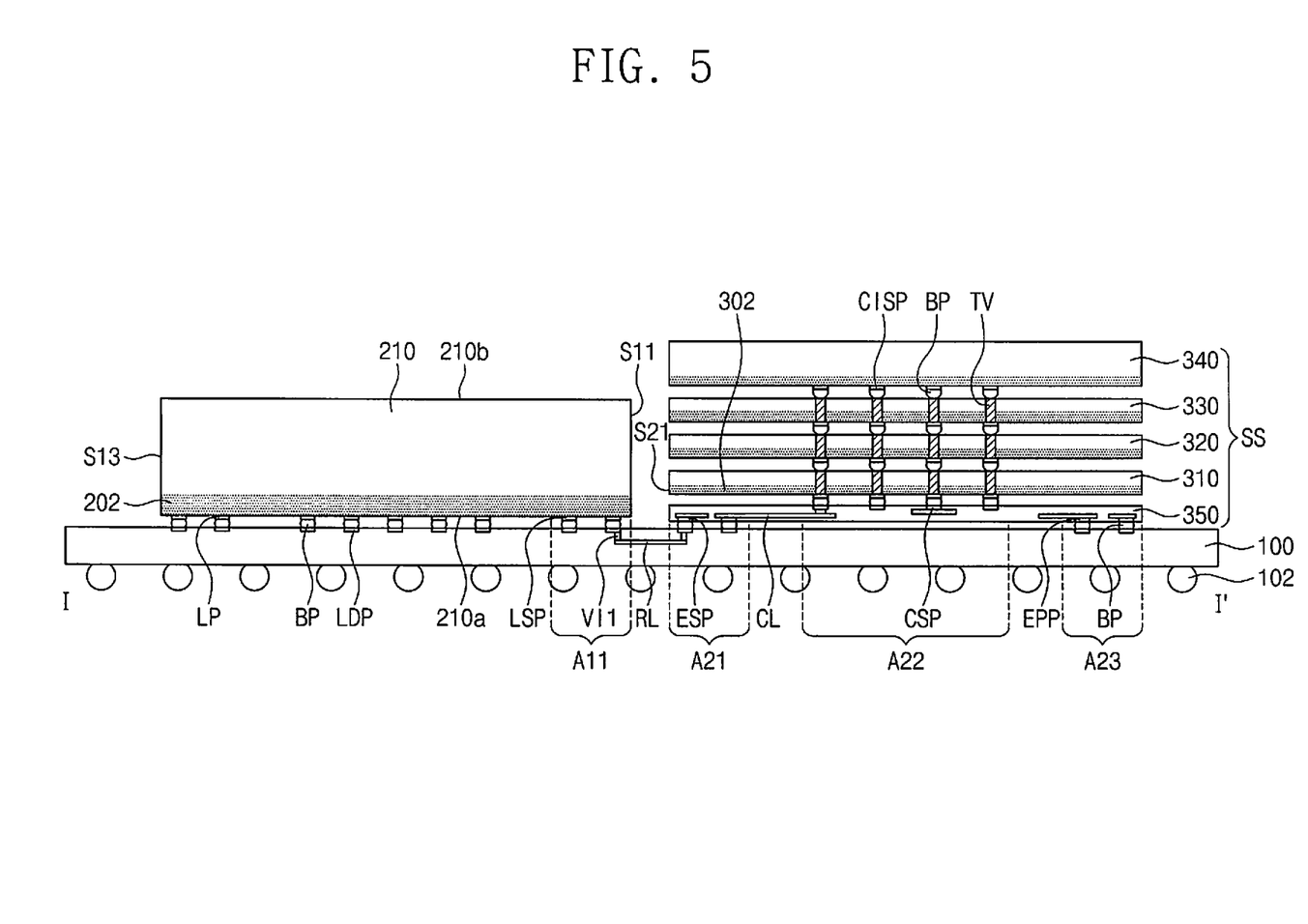
FIG. 5 illustrates a cross-sectional view taken along line I-I' of FIG. 1, showing a semiconductor package according to exemplary embodiments.

FIG. 5 illustrates a cross-sectional view taken along line I-I' of FIG. 1, showing a semiconductor package according to exemplary embodiments. In the embodiment that follows, a detailed description of technical features repetitive to those discussed above with reference to FIGS. 1 to 3 will be omitted, and difference there between will be explained in detail.

Referring to FIGS. 1 and 5, the memory stack structure SS may include the first to fourth semiconductor chips 310, 320, 330, and 340, and further may include a connection substrate 350. The connection substrate 350 may be provided between the first semiconductor chip 310 and the package substrate 100. The connection substrate 350 may include edge signal pads ESP, central signal pads CSP, edge power pads EPP, and conductive lines CL. The connection substrate 350 may be substantially the same as the redistribution layer 305, but is spaced apart from the first substrate 310 along the z-direction.

The connection substrate 350 may include first to fourth sidewalls S21, S22. S23, and S24, similar to the first to fourth semiconductor chips 310, 320, 330, and 340. The first and third sidewalls S21 and S23 of the connection substrate 350 may be opposite each other along the x-direction. The second and fourth sidewalls S22 and S24 of the connection substrate 350 may be opposite each other along the y-direction. The first sidewall S11 of the logic chip 210 may be adjacent to the first sidewall S21 of the connection substrate 350. The first sidewall S11 of the logic chip 210 may face the first sidewall S21 of the connection substrate 350.

The connection substrate 350 may include the first area A21 adjacent to the first sidewall S21, the second area A22, and the third area A23 adjacent to the third sidewall S23. The second area A22 may be between the first and third areas A21 and A23. The second area A22 may be a central area of the connection substrate 350. Each of the first and third areas A21 and A23 may be an edge area spaced apart from the central area of the connection substrate 350 along the x-direction.

The edge signal pads ESP of the connection substrate 350 may be selectively disposed on the first area A21 of the connection substrate 350. The conductive lines CL of the connection substrate 350 may transmit input/output signals to the edge signal pads ESP from the central signal pads CSP connected to the first semiconductor chip 310. For example, the connection substrate 350 may redistribute input/output pads of the first semiconductor chip 310 from the second area A22 to the first area A21.

The edge signal pads ESP of the connection substrate 350 may be relatively close to the logic chip 210. In such a configuration, an electrical connection path may become decreased between the logic chip 210 and the memory stack structure SS.

Figure 6:
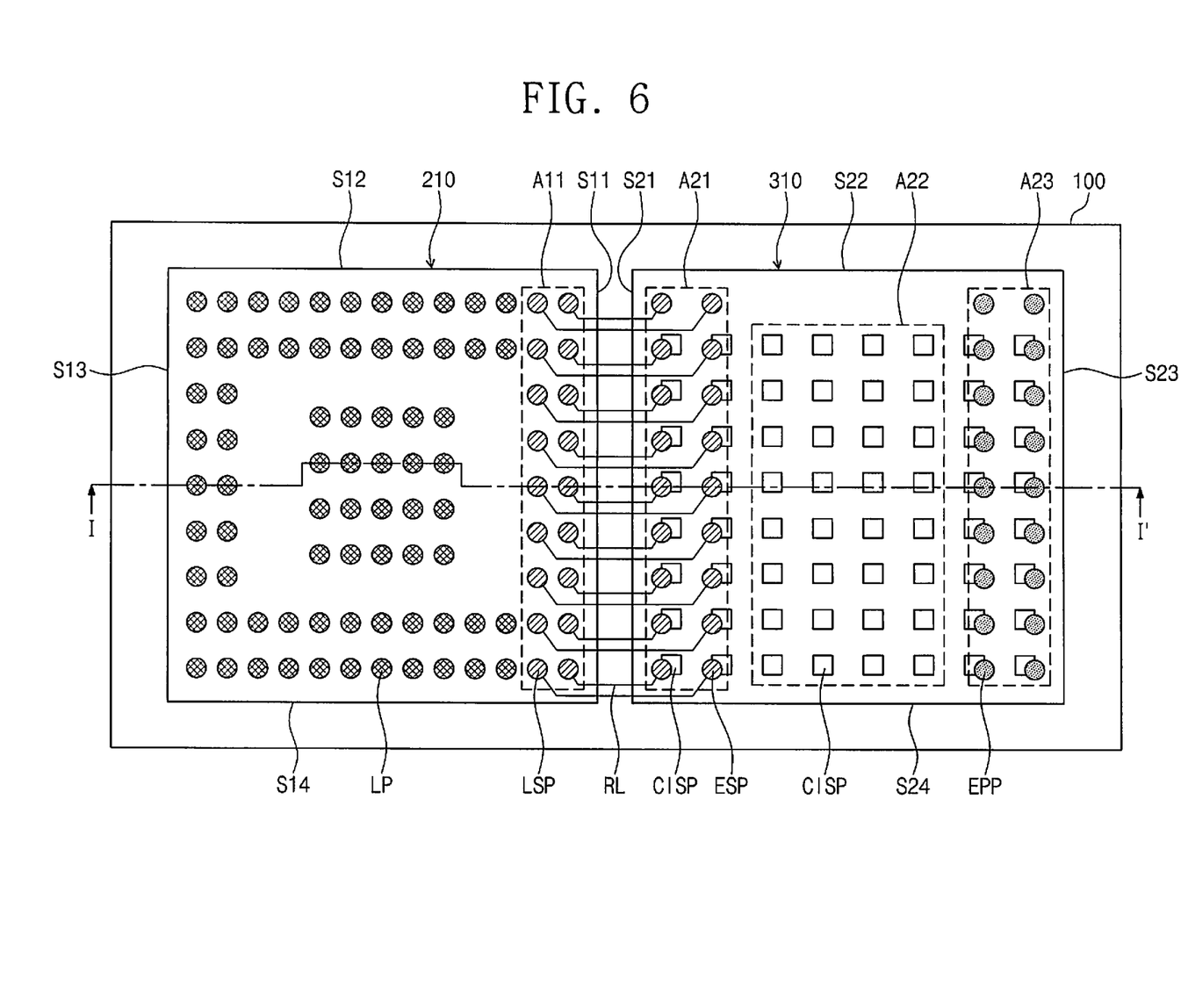
FIG. 6 illustrates a plan view showing a semiconductor package according to exemplary embodiments.
Figure 7:
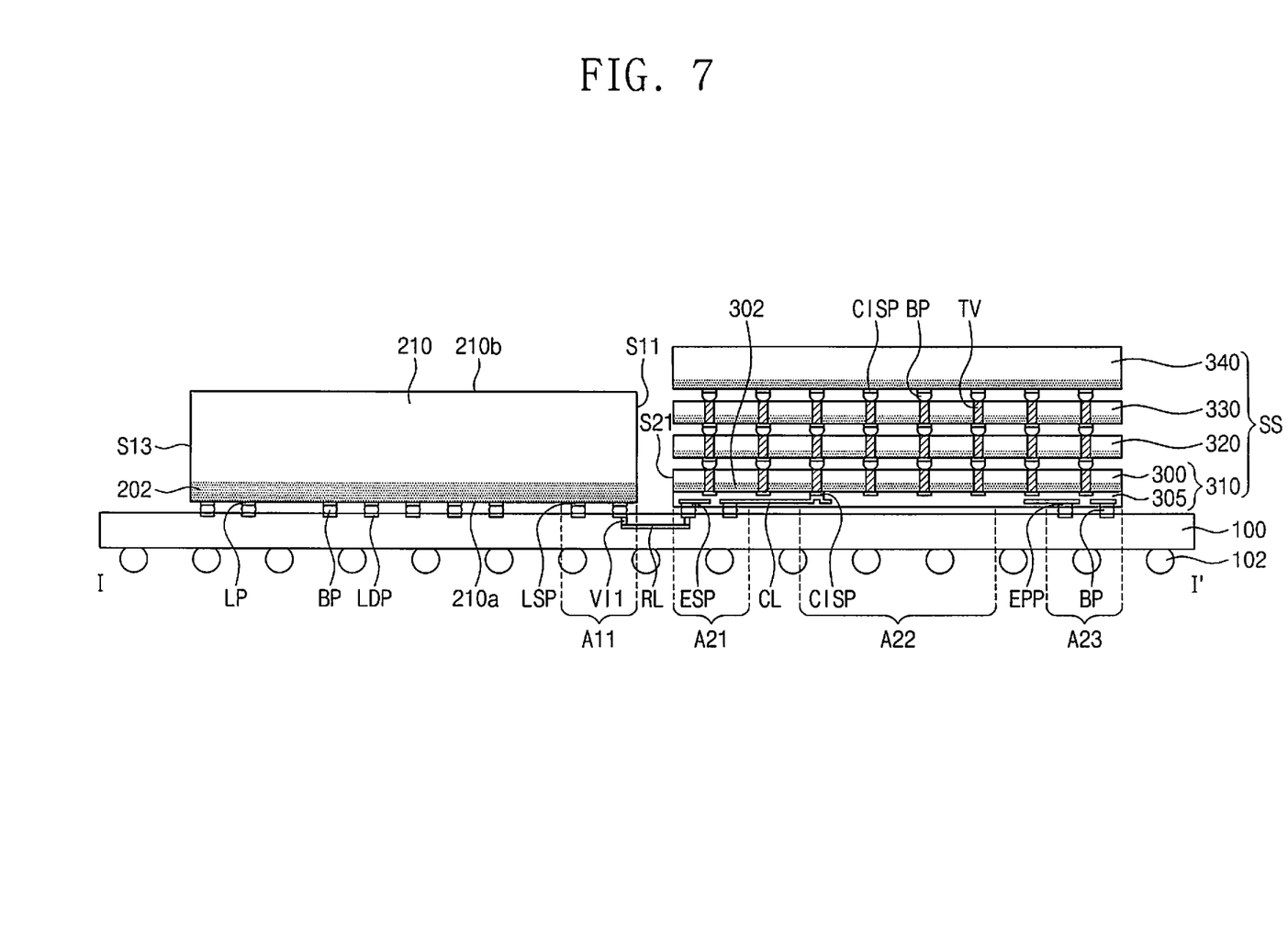
FIG. 7 illustrates a cross-sectional view taken along line I-I' of FIG. 6, showing a semiconductor package according to exemplary embodiments.

FIG. 6 illustrates a plan view showing a semiconductor package according to exemplary embodiments. FIG. 7 illustrates a cross-sectional view taken along line I-I' of FIG. 6. In the embodiment that follows a detailed description of technical features repetitive to those discussed above with reference to FIGS. 1 to 3 will be omitted, and differences there between will be explained in detail.

Referring to FIGS. 6 and 7, each of the first to fourth semiconductor chips 310, 320, 330, and 340 may include chip signal pads CISP on the active layer 302. The chip signal pads CISP of each of the first to fourth semiconductor chips 310, 320, 330, and 340 may be not only on the second area A22, but also on the first and third areas A21 and A23. For example, the chip signal pads CISP may be uniformly distributed over the whole area of each of the first to fourth semiconductor chips 310, 320, 330, and 340. The chip signal pads CISP of the first to fourth semiconductor chips 310, 320, 330, and 340 may vertically overlap each other, e.g., along the z-direction. The chip signal pads CISP may be command input/output pads, access input/output pads, and/or data input/output pads of the first to fourth semiconductor chips 310, 320, 330, and 340.

The through vias TV may be connected to the chip signal pads CISP of each of the first to fourth semiconductor chips 310, 320, 330, and 340. The through vias TV may thus be disposed not only on the second area A22, but also on the first and third areas A21 and A23.

The first semiconductor chip 310 may include the redistribution layer 305 on the active layer 302 and the chip signal pads CISP. The redistribution layer 305 may include the edge signal pads ESP, the edge power pads EPP, and the conductive lines CL.

The edge signal pads ESP and the edge power pads EPP may be provided on a lower portion of the redistribution layer 305. At least one of the conductive lines CL may electrically connect the chip signal pad CISP of the first semiconductor chip 310 to the edge signal pad ESP of the redistribution layer 305. Each of the edge power pads EPP may be a power pad supplied with a power voltage or a ground voltage.

The redistribution layer 305 may connect the chip signal pads CISP distributed on the first to third areas A21, A22, and A23 of the first semiconductor chip 310 to the edge signal pads ESP concentrated on the first area A21 adjacent to the logic chip 210. For example, the redistribution layer 305 may redistribute input/output pads of the first semiconductor chip 310 in such a way that the redistributed input/output pads may be concentrated on the first area A21.

In accordance with one or more embodiments, a semiconductor package according have a fast signal transfer between a logic chip and a memory stack structure, thereby improving electrical characteristics and increasing operating speed. The logic chip and the memory stack structure may be disposed side by side to decrease a size of the semiconductor package along a stacking direction.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a package substrate;
   a logic chip on the package substrate;
   a memory stack structure on the package substrate, the memory stack structure including a first semiconductor chip and a second semiconductor chip stacked on the first semiconductor chip along a first direction, the memory stack structure being spaced apart from the logic chip along a second direction, crossing the first direction; and
   a first bump between the package substrate and the memory stack structure,
   wherein the first semiconductor chip includes:
     a first area adjacent to the logic chip and a second area on a center of the first semiconductor chip;
     a through via electrically connected to the second semiconductor chip;
     a chip signal pad connected to the through via; and
     a first redistribution layer electrically connected to the chip signal pad and having an edge signal pad in contact with the first bump, wherein
     along the second direction, a distance between the logic chip and the edge signal pad is less than a distance between the logic chip and the chip signal pad,
     the edge signal pad is on the first area, and
     the chip signal pad is on the second area.

2. The semiconductor package as claimed in claim 1, wherein:
   the chip signal pad includes a plurality of chip signal pads,
   a first signal pad of the plurality of chip signal pads is on the first area, and
   a second signal pad of the plurality of chip signal pads is on the second area.

3. The semiconductor package as claimed in claim 1, wherein:
   the first semiconductor chip further has a third area,
   the second area is in between the first area and the second area along the second direction,
   the first redistribution layer further includes an edge power pad that is connected to the package substrate and is supplied with a power voltage or a ground voltage,
   the edge power pad being on the third area.

4. The semiconductor package as claimed in claim 1, wherein the first redistribution layer is spaced apart from the memory stack structure along the first direction.

5. The semiconductor package as claimed in claim 1, wherein the first redistribution layer further includes a conductive line that extends from the chip signal pad toward the edge signal pad along the second direction, and electrically connects the chip signal pad and the edge signal pad to each other.

6. The semiconductor package as claimed in claim 1, wherein the package substrate includes a routing line through which an input/output signal is transmitted between the logic chip and the edge signal pad.

7. The semiconductor package as claimed in claim 1, wherein:
   the second semiconductor chip includes a second redistribution layer whose structure is substantially the same as that of the first redistribution layer, and
   an edge signal pad of the second redistribution layer is a dummy pad.

8. The semiconductor package as claimed in claim 7, wherein:
   the first bump is between the package substrate and the edge signal pad;
   the memory stack structure further includes a second bump between the first semiconductor chip and the second semiconductor chip, and
   a chip signal pad on a center of the second semiconductor chip, spaced apart from the edge signal pad of the second redistribution layer along the second direction, is in contact with the second bump.

9. The semiconductor package as claimed in claim 1, further comprising a second bump between the package substrate and the logic chip, wherein
   the logic chip has a first sidewall facing the memory stack structure,
   the logic chip includes a logic signal pad adjacent to the first sidewall and in contact with the second bump is attached, and
   the logic signal pad and the edge signal pad are electrically connected to each other through the package substrate.

10. A semiconductor package, comprising:
    a package substrate including a routing line;
    a logic chip on the package substrate;
    a memory stack structure on the package substrate, the memory stack structure including a first semiconductor chip and a second semiconductor chip stacked on the first semiconductor chip along a first direction, the memory stack structure being spaced apart from the logic chip along a second direction, crossing the first direction, wherein:

a first sidewall of the logic chip faces a second sidewall of the first semiconductor chip along the second direction, the logic chip includes a logic signal pad adjacent to the first sidewall, the first semiconductor chip includes:
- a through via electrically connected to the second semiconductor chip;
- a chip signal pad connected to the through via; and
- a first redistribution layer electrically connected to the chip signal pad and having an edge signal pad adjacent to the second sidewall, and the logic signal pad and the edge signal pad are electrically connected to each other through the routing line; and a first bump between the package substrate and the edge signal pad, wherein:

the first semiconductor chip has a first area adjacent to the second sidewall and a second area at a center of the first semiconductor chip, the edge signal pad is on the first area, and the first bump is spaced apart from the second area along the second direction.

11. The semiconductor package as claimed in claim 10, further comprising an insulating material between the package substrate and the second area of the first semiconductor chip.

12. The semiconductor package as claimed in claim 10, wherein the first redistribution layer further includes a conductive line that extends from the chip signal pad toward the edge signal pad along the second direction that electrically connects the chip signal pad and the edge signal pad to each other.

13. The semiconductor package as claimed in claim 10, wherein:
- the second semiconductor chip includes a second redistribution layer whose structure is substantially the same as that of the first redistribution layer, and
- an edge signal pad of the second redistribution layer is a dummy pad.

* * * * *